United States Patent
Kim et al.

(10) Patent No.: US 8,292,684 B2
(45) Date of Patent: Oct. 23, 2012

(54) METHOD OF MANUFACTURING FLAT PANEL DISPLAY DEVICE

(75) Inventors: Hyung-Sik Kim, Suwon-si (KR); Jin-Han Park, Suwon-si (KR); Joon-Hyung Kim, Suwon-si (KR); Hyun-Chul Lee, Suwon-si (KR); Sung-Gon Kim, Suwon-si (KR); Tae-Wook Kang, Suwon-si (KR); Jong-Dae Kim, Suwon-si (KR); Gyoo-Wan Han, Suwon-si (KR); Cheol-Lae Roh, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 468 days.

(21) Appl. No.: 12/485,380

(22) Filed: Jun. 16, 2009

(65) Prior Publication Data

US 2010/0035503 A1    Feb. 11, 2010

(30) Foreign Application Priority Data

Aug. 7, 2008    (KR) .......................... 10-2008-0077552

(51) Int. Cl.
*H01J 9/24* (2006.01)
*H01J 9/26* (2006.01)

(52) U.S. Cl. ............................. 445/25; 313/512; 445/24

(58) Field of Classification Search .............. 445/23–25; 313/512
See application file for complete search history.

(56) References Cited

U.S. PATENT DOCUMENTS

| | | | |
|---|---|---|---|
| 2006/0234593 A1* | 10/2006 | Kim | 445/24 |
| 2006/0286889 A1* | 12/2006 | Nishi et al. | 445/24 |
| 2007/0128967 A1 | 6/2007 | Becken et al. | |
| 2007/0178387 A1* | 8/2007 | Ishida et al. | 430/5 |
| 2007/0195634 A1* | 8/2007 | Lee | 365/230.05 |
| 2008/0018229 A1* | 1/2008 | Yamazaki | 313/498 |
| 2008/0171485 A1 | 7/2008 | Choi et al. | |
| 2008/0264359 A1* | 10/2008 | Marsh et al. | 123/41.33 |

FOREIGN PATENT DOCUMENTS

| | | | |
|---|---|---|---|
| JP | 360250345 | * | 12/1985 |
| JP | 2008-170926 A | | 7/2008 |

OTHER PUBLICATIONS

Japanese Office action issued by Japanese Patent Office on Jun. 19, 2012, corresponding to Japanese Patent Application No. 2009-183461, which foregoing one foreign patent reference is cited, and Request for Entry attached herewith.

* cited by examiner

*Primary Examiner* — Bumsuk Won
(74) *Attorney, Agent, or Firm* — Robert E. Bushnell, Esq.

(57) ABSTRACT

To minimize stress variations applied to mother glasses when a glass sealing material is melted via a laser to combine the mother glasses, a method of manufacturing a flat panel display device includes providing a plurality of emission units between a first substrate and a second substrate, wherein the first substrates faces the second substrate and each emission unit forms a unit display device; providing a plurality of walls between the first substrate and the second substrate, wherein each wall respectively surrounds one of the emission units; irradiating a laser beam onto the walls, wherein the laser beam is simultaneously irradiated to wall portions aligned in a row in a first direction; scanning the laser beam in a second direction, wherein the second direction is different from the first direction to irradiate other wall portions of the plurality of walls; and cutting the first and second substrates to obtain individual display devices.

26 Claims, 7 Drawing Sheets

METHOD OF MANUFACTURING FLAT PANEL DISPLAY DEVICE

CROSS-REFERENCE TO RELATED APPLICATIONS

This application claims the benefit of Korean Patent Application No. 2008-77552, filed on Aug. 7, 2008, in the Korean Intellectual Property Office, the disclosure of which is incorporated herein by reference.

BACKGROUND OF THE INVENTION

1. Field of the Invention

Aspects of the present invention relate to a method of manufacturing a flat panel display device, and more particularly, to a method of manufacturing a flat panel display device sealed with a glass sealing material.

2. Description of the Related Art

In general, flat panel display devices such as organic light emitting display devices or thin film transistor-liquid crystal displays (TFT-LCDs) can be manufactured to have a thin and flexible structure. Because of these useful properties, research into flat panel display devices is being actively performed.

Typically, organic light emitting display devices may be degraded by humidity. Accordingly, there is a need for a sealing structure that prevents the permeation of humidity.

Conventionally, a metal can or glass substrate, which is a sealing member, is formed into a cap-shaped structure having grooves. Then, the grooves are filled with desiccant powder to absorb humidity. Alternatively, a desiccant film may be attached to the grooves by using a double-sided tape in order to absorb humidity. Then, the sealing member and a substrate, which include light emitting devices, are combined with each other and sealed with an ultraviolet (UV) hardening organic sealant or thermal hardening organic sealant.

Organic sealants for combining the sealing member and the substrate are susceptible to pressure. In addition, the humidity-resistance characteristics of organic sealants quickly decrease over time, and the sealing effect is decreases.

Due to these and/or other problems, a glass sealing material has recently been used instead of organic sealants to obtain excellent pressure-resistance characteristics and sealing characteristics. A laser beam is used to melt the glass sealing material.

US Patent Application No. 2007/0128967 discloses a sealing method using a glass sealing material and using a laser beam to melt the glass sealing material.

In the disclosed method, a plurality of emission devices are interposed between a pair of mother glasses that face each other. Each emission device is then completely surrounded by a closed loop structure formed of a glass sealing material, and then a laser beam is irradiated to the closed loop structure to melt the glass sealing material.

Since the laser beam is irradiated to the glass sealing material along the closed loop structure surrounding each emission device, the irradiation track that the laser beam travels may have the same shape as that of the closed loop structure that surrounds each emission device. Accordingly, the laser beam forms the same number of closed loop structures as the number of emission devices.

In this method, the cut surfaces of the mother glasses may have defects due to thermal stress generated during laser beam irradiation.

When the glass sealing material is melted by the laser beam to combine the mother glasses, a cycle of increasing and decreasing of the temperature is repeated when the glass sealing material is melted and cooled. As a result, various thermal impacts are applied to the mother glasses, and thus, non-uniform stresses occur in the mother glasses. Due to non-uniform stresses, it may be difficult to cut the mother glasses accurately, and cut sides thereof may have protrusions. In addition, portions of the mother glasses corresponding to part of the emission devices may expand and form visible Newton-ring structures.

Furthermore, whenever laser beams are irradiated onto neighboring emission devices, more stress variations occur in the mother glasses.

SUMMARY OF THE INVENTION

Aspects of the present invention provide a method of manufacturing a flat panel display device, in which stress variations applied to mother glasses when a glass sealing material is melted to combine the mother glasses are minimized.

According to an embodiment of the present invention, there is provided a method of manufacturing a flat panel display device, the method including: providing a plurality of emission units between a first substrate and a second substrate, wherein the first substrate faces the second substrate and each emission unit forms a unit display device; providing a plurality of walls between the first substrate and the second substrate, wherein each of the walls respectively surrounds one of the emission units; simultaneously irradiating a laser beam onto a plurality of first wall portions aligned in a row in a first direction; scanning the laser beam in a second direction, wherein the second direction is different from the first direction to irradiate other wall portions of the plurality of walls; and cutting the first and second substrates to obtain individual display devices.

According to an aspect of the present invention, the first direction may be perpendicular to the second direction.

According to an aspect of the present invention, each of the walls surrounding an emission unit comprises the first wall portions, which extend in the first direction, and second wall portions, which extend in the second direction, wherein the laser beam is simultaneously irradiated onto each of the first wall portions aligned in a row in the first direction, and simultaneously irradiated to at least a portion of the second walls.

According to an aspect of the present invention, the laser beam passes through a mask and arrives at the walls, wherein the mask includes: a light transmissible region through which the laser beam passes; and a light shielding region which shields the laser beam, surrounds the light transmissible region, and comprises a plurality of shielding portions that are separated and arranged in a direction in which the laser beam passes.

According to an aspect of the present invention, a dielectric layer may be interposed between the plurality of shielding portions.

According to an aspect of the present invention, the mask may comprise a transparent glass having a first surface and a second surface, wherein the first surface faces the second surface, and the light shielding region may comprise a first shield portion formed on the first surface of the transparent glass and a second shield portion formed on the second surface of the transparent glass.

According to an aspect of the present invention, the first shield portion and the second shield portion may have different patterns.

According to an aspect of the present invention, the light transmissible region and the walls may have the same patterns.

According to an aspect of the present invention, the transmissible region and the walls may have different patterns.

According to an aspect of the present invention, the light transmissible region may have a pattern that exposes the surrounding portion of each of the walls.

According to an aspect of the present invention, the light shielding region may include a light reflection layer that reflects the laser beam.

According to an aspect of the present invention, the light shielding region may include a light absorbance layer that absorbs the laser beam.

According to an aspect of the present invention, the laser beam may be irradiated by a plurality of laser emission diodes that are connected to each other and aligned in a row, and simultaneously emit light.

According to an aspect of the present invention, the laser beam is a rectangular linear laser beam, wherein a longer side of the linear laser beam has a length corresponding to the width of the plurality of walls aligned in the first direction.

According to another embodiment of the present invention, there is provided a method of manufacturing a flat panel display device, the method comprising providing a first substrate, a second substrate, a plurality of emission units disposed on the first substrate or the second substrate and a plurality of walls of a laser sealable material, wherein the first substrates faces the second substrate, wherein each emission unit forms a unit display device, wherein each emission unit is surrounded by one of the plurality of walls, wherein each of the plurality of walls includes first wall portions extending in a first direction and a second wall portions extending in a second direction different from the first direction and wherein the plurality of emission units are arranged to provide a plurality of the first wall portions aligned in a row in the first direction; providing a laser illuminator comprising a plurality of laser emitters extending in the first direction; scanning the laser illuminator in the second direction such that first wall portions aligned in a row in the first direction are simultaneously irradiated and second wall portions extending in the second direction are progressively irradiated as the laser illuminator is scanned, such that each emission unit becomes sealed to provide a unit display device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
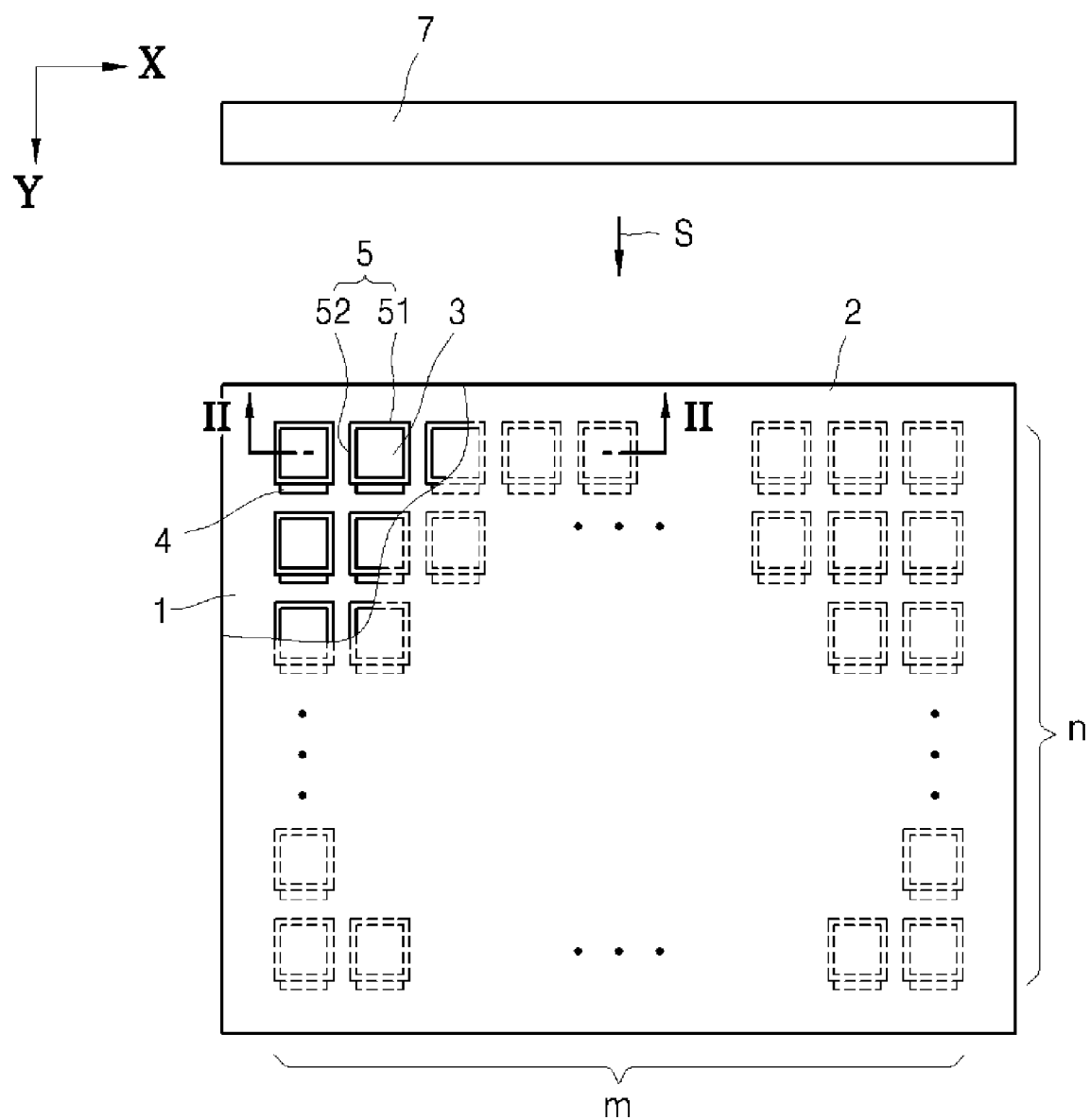
FIG. 1 a plan view of a substrate and a laser illuminator that are used in manufacturing a flat panel display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

It is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Hereinafter, an embodiment of the present invention will be described in detail with reference to the accompanying drawings.

Figure 2:
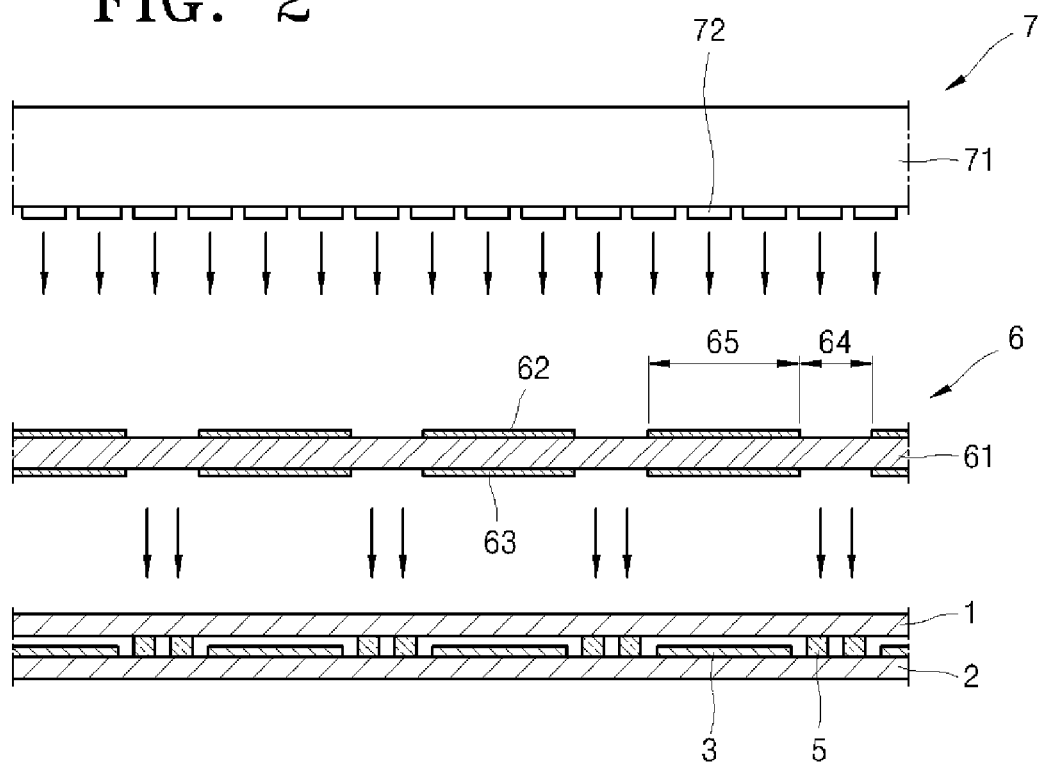
FIG. 2 includes a sectional view of the substrate of FIG. 1 taken along line II-II of FIG. 1, a sectional view of a mask and a sectional view of the laser illuminator.

FIG. 1 a plan view of a substrate and a laser illuminator that are used in a method of manufacturing a flat panel display device according to an embodiment of the present invention, and FIG. 2 includes a sectional view taken along a line II-II of FIG. 1, a sectional view of a mask and a sectional view of the laser illuminator.

Referring to FIGS. 1 and 2, a first substrate 1 faces a second substrate 2. The first substrate 1 has a plurality of emission units 3 formed thereon. The first substrate 1 and the second substrate 2 are mother glasses to form a plurality of unit devices.

Each of the first substrate 1 and the second substrate 2 may be a transparent substrate. Alternatively, any one of the first substrate 1 and second substrate 2 may be a non-transparent substrate, with the other one of the first substrate 1 and second substrate 2 being a transparent substrate.

Each of the emission units 3 may include a plurality of emission devices. For example, each of the emission units 3 may be an organic emission unit including a plurality of organic emission devices.

Figure 3:
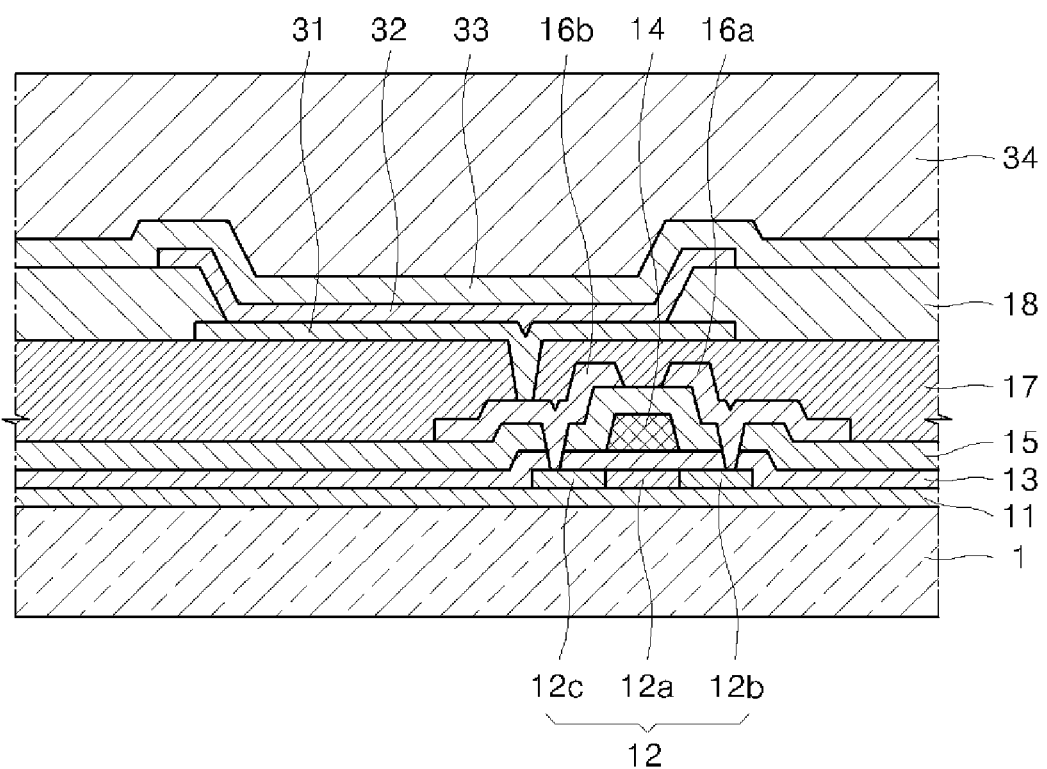
FIG. 3 is a sectional view of an emission unit disposed on the substrate illustrated in FIG. 1.

FIG. 3 is a sectional view illustrating an example of an organic emission device that may be included in the emission unit 3, specifically, an organic light emitting device (OLED) that is actively driven.

Referring to FIG. 3, an insulating layer 11 is disposed on the first substrate 1. The insulating layer 11 may be a barrier layer for preventing diffusion of impurity ions and/or permeation of humidity or external gas, and for planarizing a surface of the resultant structure.

An activation layer 12 of a thin film transistor (TFT), which is formed of a semiconductor material, is disposed on the insulating layer 11, and a gate insulating layer 13 covers the activation layer 12. The activation layer 12 may be formed of an inorganic semiconductor, such as an amorphous silicon or poly silicon, or an organic semiconductor. The activation layer 12 includes a source region 12b, a drain region 12c, and a channel region 12a formed between the source region 12b and the drain region 12c.

A gate electrode 14 is disposed on the gate insulating layer 13, and an interlayer insulating layer 15 covers the gate electrode 14. A source electrode 16a and a drain electrode 16b are disposed on the interlayer insulating layer 15, and a planarization layer 17 and a pixel definition layer 18 are sequentially formed on the resultant structure.

The gate insulating layer 13, the interlayer insulating layer 15, the planarization layer 17, and the pixel definition layer 18 may be formed of insulating materials. Each of the gate insulating layer 13, the interlayer insulating layer 15, the planarization layer 17, and the pixel definition layer 18 may be formed as a single layer or may include multiple layers. In addition, each of the gate insulating layer 13, the interlayer insulating layer 15, the planarization layer 17, and the pixel definition layer 18 may be formed of an organic material, an inorganic material, or organic/inorganic composite.

The stack structure of the TFT is not limited to the structure described above, and the TFT may have other stack structures.

A pixel electrode 31, which is an electrode of the OLED, is disposed on the planarization layer 17 and the pixel definition layer 18 is disposed on the pixel electrode 31. The pixel definition layer 18 has an opening exposing the pixel electrode 31. An organic emission layer 32 of the OLED is formed on the pixel electrode 31.

The OLED emits red, green, or blue light according to the flow of current and displays predetermined image information. The OLED includes the pixel electrode 31 contacting the drain electrode 16b of the TFT through a contact hole, an opposite electrode 33 covering all pixels, and an organic emission layer 32 disposed between the pixel electrode 31 and the opposite electrode 33. The organic emission layer 32 emits light.

The pixel electrode 31 is insulated from the opposite electrode 33 by the organic emission layer 32. The pixel electrode 31 and the opposite electrode 33 apply voltages having different polarities to the organic emission layer 32 so that the organic emission layer 32 emits light.

The organic emission layer 32 may be a small molecule organic layer or a polymer organic layer. When the organic emission layer 32 is a small molecule organic layer, the organic emission layer 32 may include a hole injection layer (HIL), a hole transport layer (HTL), an emission layer (EML), an electron transport layer (ETL), and an electron injection layer (EIL), wherein each layer may be a single layer or may have multiple layers. Examples of available small molecule organic materials include copper phthalocyanine (CuPc), N,N'-di naphthalene-1-yl-N,N'-diphenyl-benzidine (NPB), and tris-8-hydroxyquinoline aluminum (Alq3). The small molecule organic layer may be formed by vacuum deposition. The HIL, the HTL, the ETL, and the EIL are common layers with respect to red, green, and blue pixels. Accordingly, unlike the structure illustrated in FIG. 3, these common layers may be formed to cover all of the pixels of an emission unit 3 in the same manner as the opposite electrode 33.

The pixel electrode 31 may function as an anode and the opposite electrode 33 may function as a cathode. Alternatively, the pixel electrode 31 may function as a cathode and the opposite electrode 33 may function as an anode.

In the case of a bottom emission type organic light emitting display device, which is a display device in which an image is formed at the side of the first substrate 1, the pixel electrode 31 may be a transparent electrode and the opposite electrode 33 may be a reflective electrode. The pixel electrode 31 may be formed of a material having a high work function, such as ITO, IZO, ZnO, or $In_2O_3$, and the opposite electrode 33 may be formed of metal having a low work function, such as Ag, Mg, Al, Pt, Pd, Au, Ni, Nd, Ir, Cr, Li, or Ca.

In the case of a top emission type organic light emitting display device, which is a display device in which an image is formed at the side of the opposite electrode 33, the pixel electrode 31 may be a reflective electrode and the opposite electrode 33 may be a transparent electrode. The pixel electrode 31 may include a reflective layer formed of metal, such as Ag, Mg, Al, Pt, Pd, Au, Ni, Nd, Ir, Cr, Li, Ca or a mixture thereof; and a material having a high work function, such as ITO, IZO, ZnO, or $In_2O_3$. The opposite electrode 33 may be formed by depositing metal having a low work function, such as Ag, Mg, Al, Pt, Pd, Au, Ni, Nd, Ir, Cr, Li, Ca or a mixture thereof, and depositing a transparent conductive material, such as ITO, IZO, ZnO, or $In_2O_3$, thereon to form an assistance electrode layer or a bus electrode line.

In an emission type organic light emitting display device that forms an image in both directions, the pixel electrode 31 and the opposite electrode 33 may be transparent electrodes.

The pixel electrode 31 and the opposite electrode 33 may also be formed of other materials. For example, the pixel electrode 31 and the opposite electrode 33 may be formed of a conductive organic material or a conductive paste containing conductive particles of, for example, Ag, Mg, or Cu. The conductive paste may be applied using an inkjet printing method, and then a sintering process may be performed on the conductive paste to form an electrode.

A passivation layer 34 is disposed on the opposite electrode 33 to cover the emission unit 3. The passivation layer 34 may be formed of an inorganic material, an organic material, or an organic/inorganic composite.

It is to be understood that the structure of the organic emission device is not limited to what is described above, and other structures may be used.

As illustrated in FIG. 1, a pad unit 4 is disposed near each emission unit 3. The pad unit 4 connects the corresponding emission unit 3 to an external device (not shown), such as an integrated circuit (IC) or other circuit devices.

The number of pairs of the emission units 3 and the pad units 4 aligned in a first direction X may be m, and the number of pairs of the emission units 3 and the pad units 4 aligned in a second direction Y may be n. One emission unit 3 and one pad unit 4 forms a cell. In the cells as shown in FIG. 1, the emission unit 3 is disposed near the pad unit 4, and the emission unit 3 and the pad unit 4 are aligned with each other in the second direction Y. However, it is also possible for the emission unit 3 to disposed near the pad unit 4, and for the emission unit 3 and the pad unit 4 to be aligned with each other in the first direction X. It is also possible for the pad unit 4 to surround the emission unit 3. It is to be understood that the structure of a cell including an emission unit 3 and a pad unit 4 is not limited to what is described above and that other structures may be used.

In forming flat panel display devices, a glass sealing material in a paste state is applied in the shape of a closed loop structure, that is, in a wall structure, to a surface of the second substrate 2 facing the first substrate 1 in such a way that each emission unit 3 is surrounded by the glass sealing material, and then the glass sealing material is pre-sintered to form a wall 5. Alternatively, the wall 5 can be formed on a surface of the first substrate 1 facing the second substrate 2. In each cell, the wall 5 includes two first walls 51 and two second walls 52. The glass sealing material in a paste state may be applied sequentially to each of the cells by using a dispenser, or may be simultaneously applied to all the cells by screen-printing.

The glass sealing material in the paste state may include glass frit. The glass frit may include an absorbing material such as iron, copper, vanadium, or neodymium that absorbs an operable wavelength of a laser beam. In addition, the glass frit may further include a filler material in consideration of the thermal expansion coefficient of the first substrate 1 and/or the second substrate 2. The glass sealing material can also include any other known glass frit.

Then, the second substrate 2 on which the walls 5 are disposed and the first substrate 1 are properly arranged, and the laser illuminator 7 irradiates laser beams to the wall 5 of each cell to melt the glass sealing material. Then, the molten glass sealing material is cooled and thus, the first substrate 1 is combined with the second substrate 2. A predetermined pressure may be applied to the first substrate 1 and the second substrate 2 so that the first substrate 1 and the second substrate 2 sufficiently contact the walls 5.

As illustrated in FIG. 2, laser beams are irradiated to the first substrate 1. However, the irradiation direction of laser beams is not limited thereto. As an alternative, laser beams may be irradiated to the second substrate 2. As a further alternative, laser beams may be simultaneously irradiated to both the first substrate 1 and the second substrate 2.

According to aspects of the present invention, as illustrated in FIG. 1, laser beams may be irradiated to a first set of walls 51 surrounding the emission units 3 in a row aligned in the first direction X. Then, as illustrated in FIG. 1, the laser illuminator 7 may be moved to scan the other walls 52 in a scanning direction S, which is the second direction Y.

That is, the laser illuminator 7 simultaneously irradiates laser beams to a first set of walls 51 of a row of emission units 3 aligned in the first direction X of FIG. 1, and then moves in the second direction Y while irradiating laser beams to the other walls 52 of the row of emission units 3. Then, the laser illuminator 7 simultaneously irradiates laser beams to a second set of walls 51 of the emission units 3 aligned in the first direction X of FIG. 1 as the laser illuminator 7 completely scans across the row of emission units 3. Then, the process is repeated for the second and succeeding rows of emission units 3 as the laser illuminator 7 continues scanning in the S direction.

Since laser beams are simultaneously irradiated to the walls 51 of the emission units 3 aligned in a row in the first direction X and then, scanned in the second direction Y to irradiate the other walls 52, thermal stress may be uniformly applied to the first substrate 1 and the second substrate 2, which are mother glasses.

Accordingly, a portion of the first substrate 1 and a portion of the second substrate 2 which correspond to the emission units 3 aligned in a row in the first direction X are affected by thermal stress of the same intensity. In addition, the first substrate 1 and the second substrate 2 are exposed to the thermal stress n times, not m×n times, since entire rows of emission units 3 are irradiated simultaneously, rather than each emission unit 3 being irradiated individually in a sequence. Accordingly, the first substrate 1 and the second substrate 2 are less exposed to additional thermal stress generated when laser beams are irradiated to neighboring cells.

Figure 4:
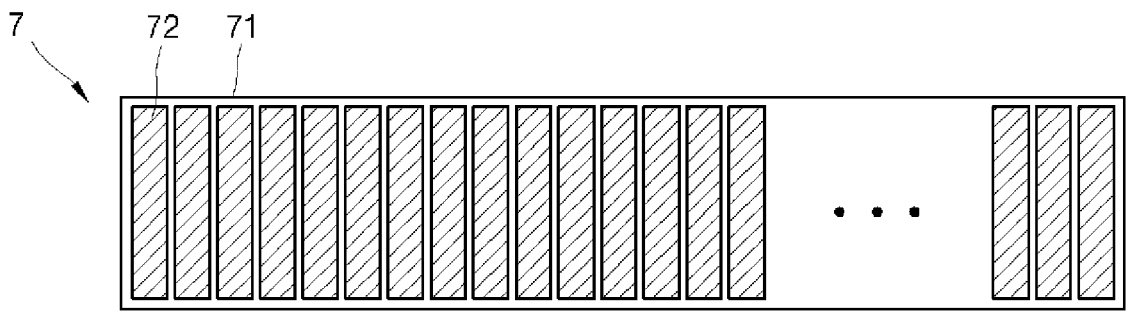
FIG. 4 is a bottom view of the laser illuminator illustrated in FIG. 1.

The walls 51 aligned in a single row in the first direction X on the first substrate 1 and the second substrate 2 may be simultaneously exposed to the laser beam irradiated by the laser illuminator 7 illustrated in FIG. 4. The laser illuminator 7 may be formed by connecting a plurality of laser emission diodes 72 arranged in a row and then aligning the laser emission diodes 72 on a substrate 71.

Each laser emission diode 72 may emit a laser beam having a wavelength of 400 to 1200 nm and have a line-bar structure. Since the laser emission diodes 72 are connected to each other and arranged in a row, the laser illuminator 7 may emit laser beams having uniform intensity. In this regard, beam spots formed by laser beams emitted from the laser emission diodes 72 may overlap and thus, a uniform linear laser beam can be obtained. The uniformity of the linear laser beam may be within ±5% with respect to all the laser beams, but is not limited thereto.

The laser illuminator 7 may further include an optical system (not shown) to focus laser beams and emit a uniform linear beam. The optical system may include a collimation lens, a homogenizing lens, and a projection lens. When laser beams are focused by an optical system, high efficiency can be obtained compared to when only laser diodes are used.

That is, laser beams may be focused to form a linear laser beam having a beam width of several hundreds µm to 2 mm.

The linear laser beam may have a rectangular cross-section. A longer side of the rectangular cross-section may have a length corresponding to a distance between the leftmost wall and a rightmost wall among the walls 51 aligned in a row in the first direction X.

The longer side of the rectangular cross-section may have a flat-top-shape energy distribution and a shorter side of the rectangular cross-section may have a Gaussian-shape or flat-top-shape energy distribution.

As illustrated in FIG. 1 and FIG. 4, the laser illuminator 7 may extend across a distance in the first direction X such that the distance between the leftmost laser emission diode 72 and the rightmost laser emission diode 72 corresponds to a width of the first direction X of the first substrate 1 and a width of the first direction X of the second substrate 2. As illustrated in FIG. 1, leftmost and rightmost emission units 3 are separated from edges of the first substrate 1 and the second substrate 2 in the X direction by predetermined distances, and thus, as an alternative, the width of the laser illuminator 7 in the first direction X may correspond to the distance between a leftmost end of a leftmost cell and a rightmost end of a rightmost cell, wherein the leftmost cell and the rightmost cell are aligned in the same row.

However, as described above, when the laser illuminator 7 includes a separate optical system, the optical system may disperse or focus the linear laser beam. Accordingly, the length of the laser illuminator 7 in the first direction X may be smaller than the widths of the first substrate 1 and the second substrate 2 in the first direction X.

A predetermined number of laser emission diodes 72 connected in a row as illustrated in FIG. 4 are defined as a unit and these units are appropriately combined for scanning a larger substrate or a smaller substrate. Accordingly, the number of units can be controlled corresponding to the size of mother glasses, and thus, laser beams may be simultaneously irradiated to selected devices arranged in a predetermined direction on mother glasses. In addition, even when the width of a linear laser beam in an X direction of laser beams emitted from the laser illuminator 7 is shorter than a width of mother glasses in the X direction, mother glasses can be completely scanned by performing the scanning process several times in the second direction Y. Accordingly, the laser illuminator 7 can also be small.

As illustrated in FIG. 2, a mask 6 may be disposed between the laser illuminator 7 and the first substrate 1 such that laser beams pass through the mask 6 and arrive at the walls 5.

The mask 6 includes a light-transmissible transparent glass 61 having a light transmissible region 64 and a light shielding region 65. The mask 6 may be positioned such that laser beams are irradiated only to the walls 5 and such that the emission units 3 are protected from the laser beams.

Figure 5:
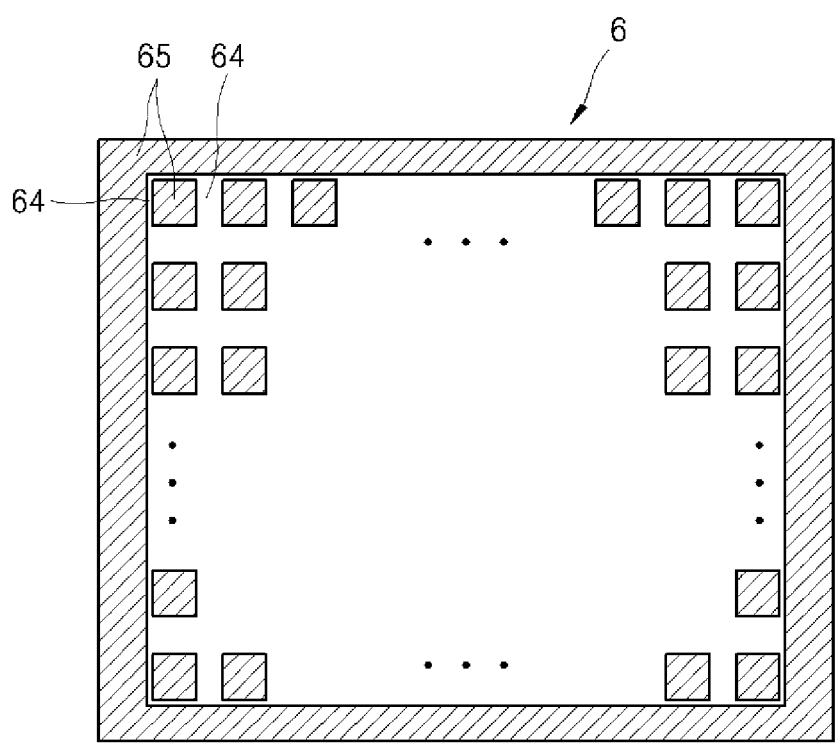
FIG. 5 is a plan view of the mask illustrated in FIG. 2 according to an embodiment of the present invention.

As illustrated in FIG. 5, the light transmissible region 64 and the light shielding region 65 are patterned to correspond to the cells of the combined first substrate 1 and second substrate 2. Specifically, the light shielding region 65 may be patterned in such a way that laser beams are not irradiated to an etch of the first substrate 1 and the emission units 3 Accordingly, as illustrated in FIG. 2, the light transmissible region 64 has an open pattern corresponding to the walls 5 between neighboring cells, and thus, the light transmissible region 64 has a sufficiently large width so that laser beams are sufficiently irradiated to the walls 5.

Figure 6:
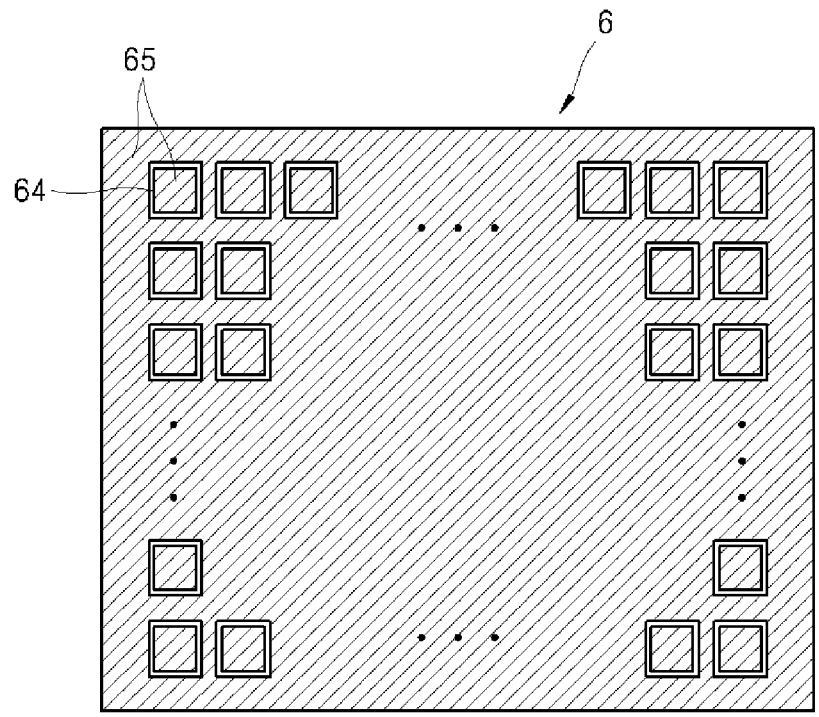
FIG. 6 is a plan view of the mask illustrated in FIG. 2 according to another embodiment of the present invention.

However, the pattern of the light transmissible region 64 is not limited to the pattern structure described above. In this regard, as illustrated in FIG. 6, the light transmissible region 64 may have a pattern corresponding to the pattern of the walls themselves.

Figure 7:
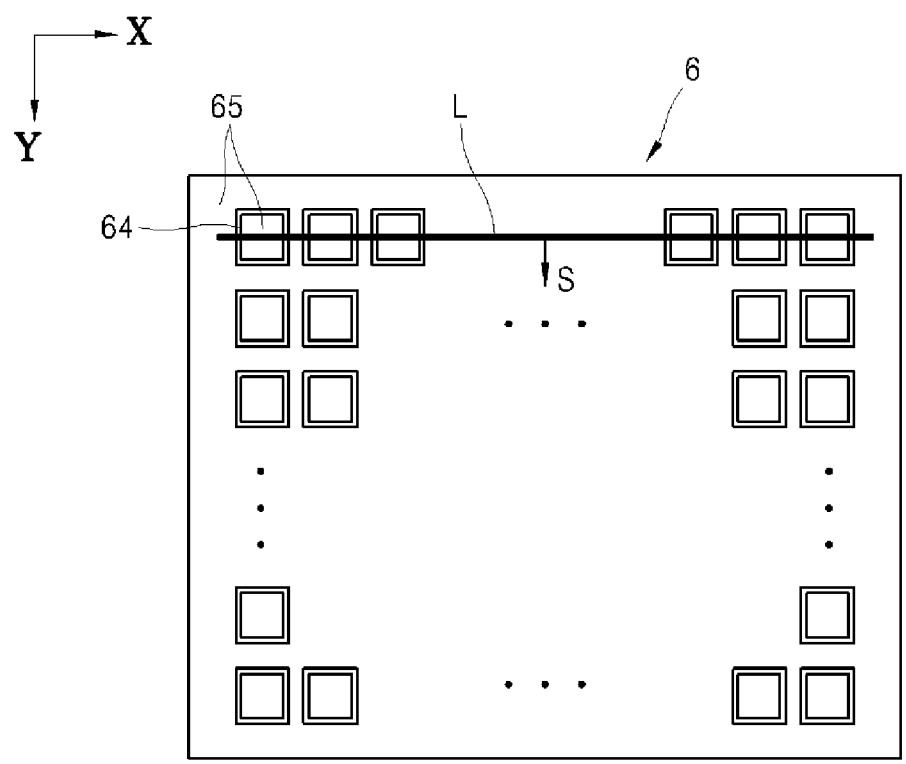
FIG. 7 is a schematic view showing a scanning process performed with a laser beam, according to an embodiment of the present invention.

The minimum width of the light transmissible regions 64 may be greater than the maximum width of the walls 5. This is because, in the beam profile of a laser beam, the intensity of the laser beam is highest in the center and substantially decreases as it moves away from the center. Accordingly, the width of the light transmissible region 64 may be appropriately adjusted so that the wall 5 is scanned with laser beams having uniform intensity When the laser illuminator 7 irradiates laser beams through the mask 6 as illustrated in FIG. 1 and the length of the linear laser beam L in the X direction is sufficiently large so that all the cells arranged in a row can be simultaneously scanned as illustrated in FIG. 7, only one scanning process S is needed to irradiate laser beams to all the cells arranged in a row.

Figure 8:
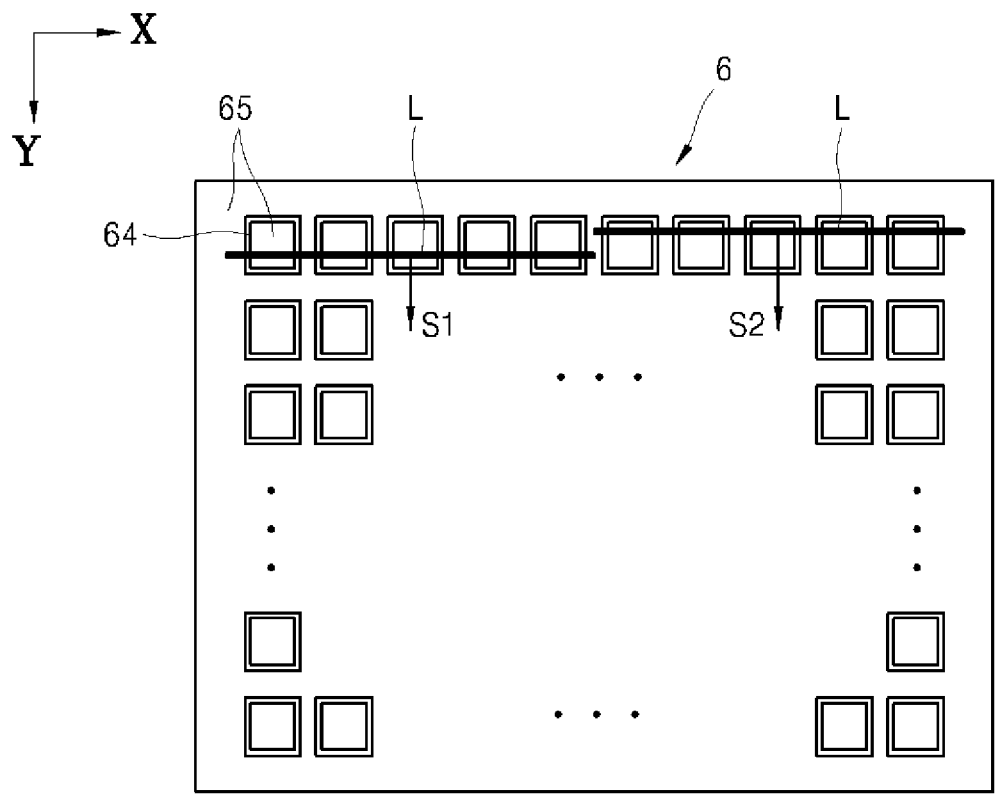
FIG. 8 is a schematic view showing a scanning process performed with a laser beam, according to another embodiment of the present invention.

On the other hand, as illustrated in FIG. 8, if the length of the linear laser beam L in the X direction is such that all the cells arranged in a row are not simultaneously scanned, for example, if the length of the linear laser beam L is such that only half of the cells arranged in a row are simultaneously scanned, a first scanning process S1 is performed in a first region and then a second scanning process S2 is performed in a second region that is situated near the first region, thereby completely scanning all the cells with laser beams.

According to aspects of the present invention, the light shielding region 65 of the mask 6 may include at least two shielding portions such as, for example, a first shield portion 62 and a second shield portion 63. The first shield portion 62 and the second shield portion 63 may be separated from each other in a direction in which laser beams pass through the mask 6. Accordingly, when a linear laser beam extending in the first direction X is irradiated, the emission units 3 can be protected from inclined laser beams.

That is, according to aspects of the present invention, laser beams are simultaneously irradiated to cells arranged in a row in the first direction X. Accordingly, a cell may be exposed to inclined laser beams emitted from laser emission diodes 72 that are situated right above neighboring cells. According to aspects of the present invention, the first and second shielding portions 62 and 63 of the light shielding region 65 are sequentially arranged in the direction in which laser beams pass through to shield neighboring cells from inclined laser beams.

Figure 9:
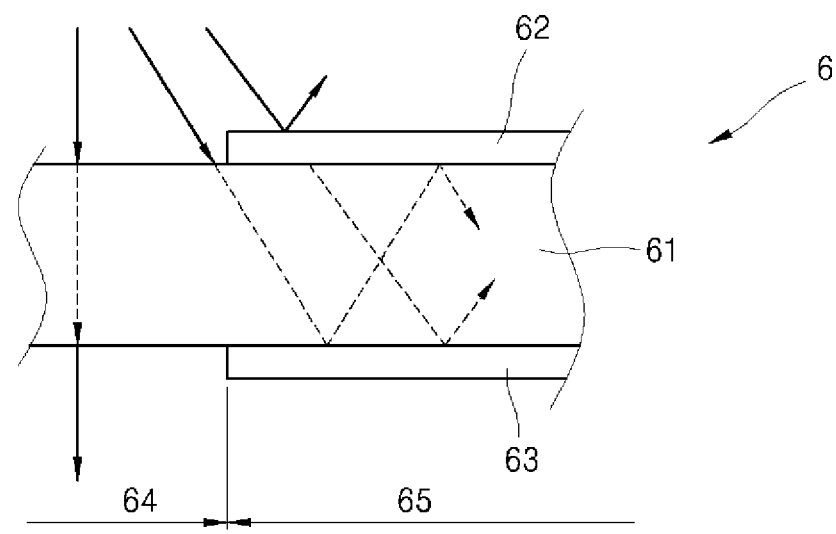
FIG. 9 is a sectional view of a mask through which a laser beam passes, according to an embodiment of the present invention.

Specifically, as illustrated in FIG. 9, since the first shield portion 62 is formed on a surface of the light-transmissible transparent glass 61 and the second shield portion 63 is formed on the opposite surface of the light-transmissible transparent glass 61, the first shield portion 62 blocks a laser beam that is incident on the light shielding region 65 at an angle of inclination, and the second shield portion 63 blocks a laser beam that transits the first shield portion 62 or a laser beam that is incident on the light transmissible region 64 at an angle of inclination. Accordingly, laser beams are irradiated only to the wall 5 without damaging the emission unit 3. That is, according to the embodiment of FIG. 9, laser beams at an angle of 90° are incident on the first and second substrates 1 and 2 and laser beams at an angle different from 90° are blocked by the first shield portion 62 and the second shield portion 63.

Figure 10:
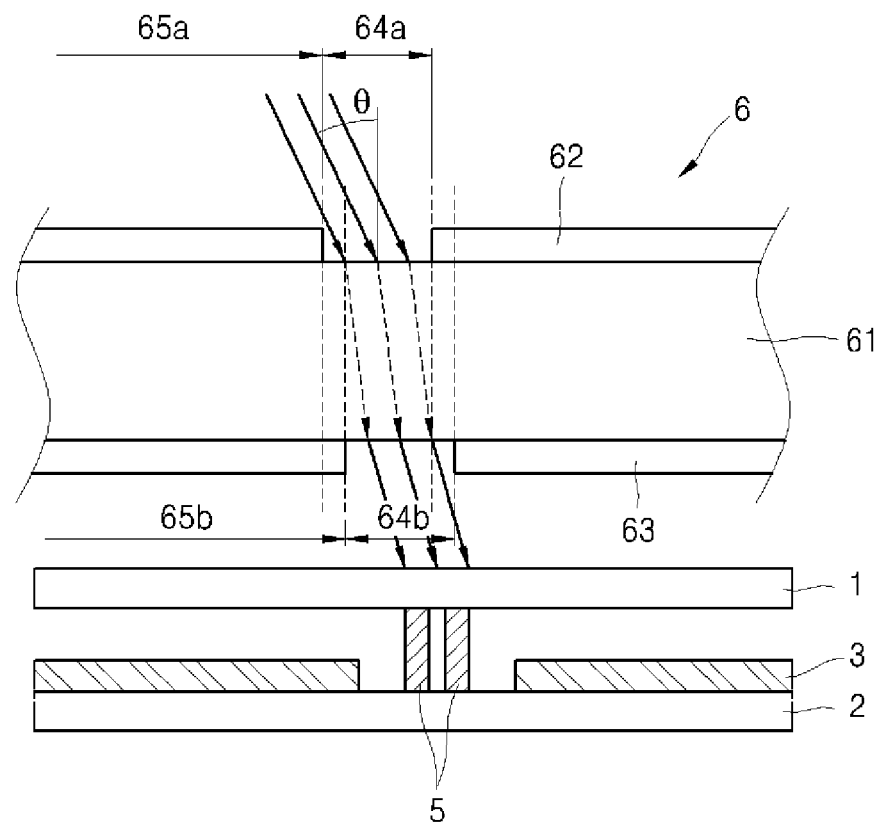
FIG. 10 is a sectional view of a mask according to another embodiment of the present invention, in which a laser beam is incident at an angle of inclination.

Alternatively, the mask 6 may be configured to allow laser beams at an angle different from 90° to be incident on the first and second substrates 1 and 2. As illustrated in FIG. 10, laser beams may be incident on the first and second substrates 1 and 2 at an incidence angle θ with respect to the normal line. In this case, a laser illuminator can be protected from being struck by a laser beam that has been irradiated from and is then reflected back towards the laser illuminator. For example, the incidence angle θ may be 30° or less.

As illustrated in FIG. 10, the first shield portion 62 and the second shield portion 63 may be arranged with different patterns selected to allow laser beams that are incident on the mask 6 at an angle θ and which are refracted when they pass through the light-transmissible transparent glass 61 of the mask 6 to be incident on the first and second substrates 1 and 2.

Since the first shield portion 62 and the second shield portion 63 have different patterns, pattern locations of a first light transmissible region 64*a* and a first light shielding region 65*a* which are defined by the first shield portion 62 are different from pattern locations of a second light transmissible region 64*b* and a first light shielding region 65*b* which are defined by the second shield portion 63. Such a change in pattern locations may be determined according to the material that is used to form the light-transmissible transparent glass 61 and the incident angle θ of the laser beam.

Figure 11:
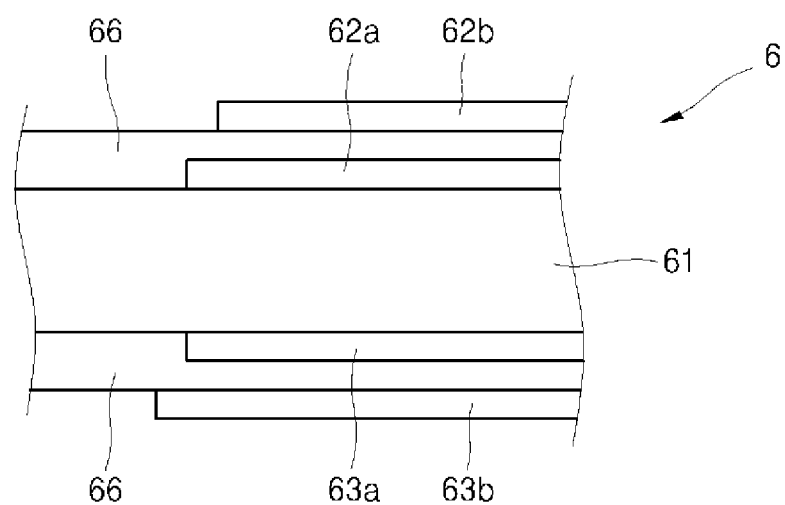
FIG. 11 is a sectional view of a mask according to another embodiment of the present invention.

As a further alternative, at least one of the first shield portion 62 and the second shield portion 63 may include a plurality of shield portions. For example, as illustrated in FIG. 11, the first shield portion 62 may include a plurality of first shield portions 62*a* and 62*b* and the second shield portion 63 may include a plurality of second shield portions 63*a* and 63*b*, and a dielectric layer 66 may be interposed between the first shield portions 62*a* and 62*b* and/or between second shield portions 63*a* and 63*b*. Although FIG. 11 illustrates the dielectric layer 66 that is formed in the entire mask 6, the present invention is not limited thereto. Thus, the dielectric layer 66 may be formed only between the first shield portions 62*a* and 62*b* and/or between the second shield portions 63*a* and 63*b*.

The interlayer structure of these shielding portions may be designed taking into consideration an incident angle θ, a beam profile, a wavelength, or a refraction angle of the laser beam.

Each of the first shield portion 62 and the second shield portion 63 may include a light reflection layer or a light absorbance layer. If the first shield portion 62 and the second shield portion 63 include light reflection layers, the first shield portion 62 and the second shield portion 63 may prevent a laser beam from being irradiated to the emission unit 3, and also, an increase in the temperature of the mask 6 caused by the laser beam can be prevented. If the first shield portion 62 and second shield portion 63 include light absorbance layers, an increase in the temperature of a chamber in which the manufacturing process is performed, caused by the laser beam can be prevented.

As illustrated in FIGS. 1 and 7, laser beams are simultaneously irradiated through the mask 6 onto the first walls 51 aligned in a row in the first direction X, and then, sequentially irradiated onto second walls 51 aligned in a row in the first direction X, wherein the first walls 51 are perpendicular to the second walls 52. That is, unlike a case in which when a laser beam is irradiated to each cell along the closed loop structure of the wall 5, in the method according to aspects of the present invention, with respect to each cell, the laser beam is simultaneously irradiated to one of the first walls 51 interposed between second walls 52 that face each other, sequentially irradiated onto the second walls 52, and then simultaneously irradiated to the other one of the first walls 51. That is, in each cell, each of the first walls 51 is simultaneously, not sequentially, melted and hardened along its entire length, and thus the adhesive force is increased.

Figure 12:
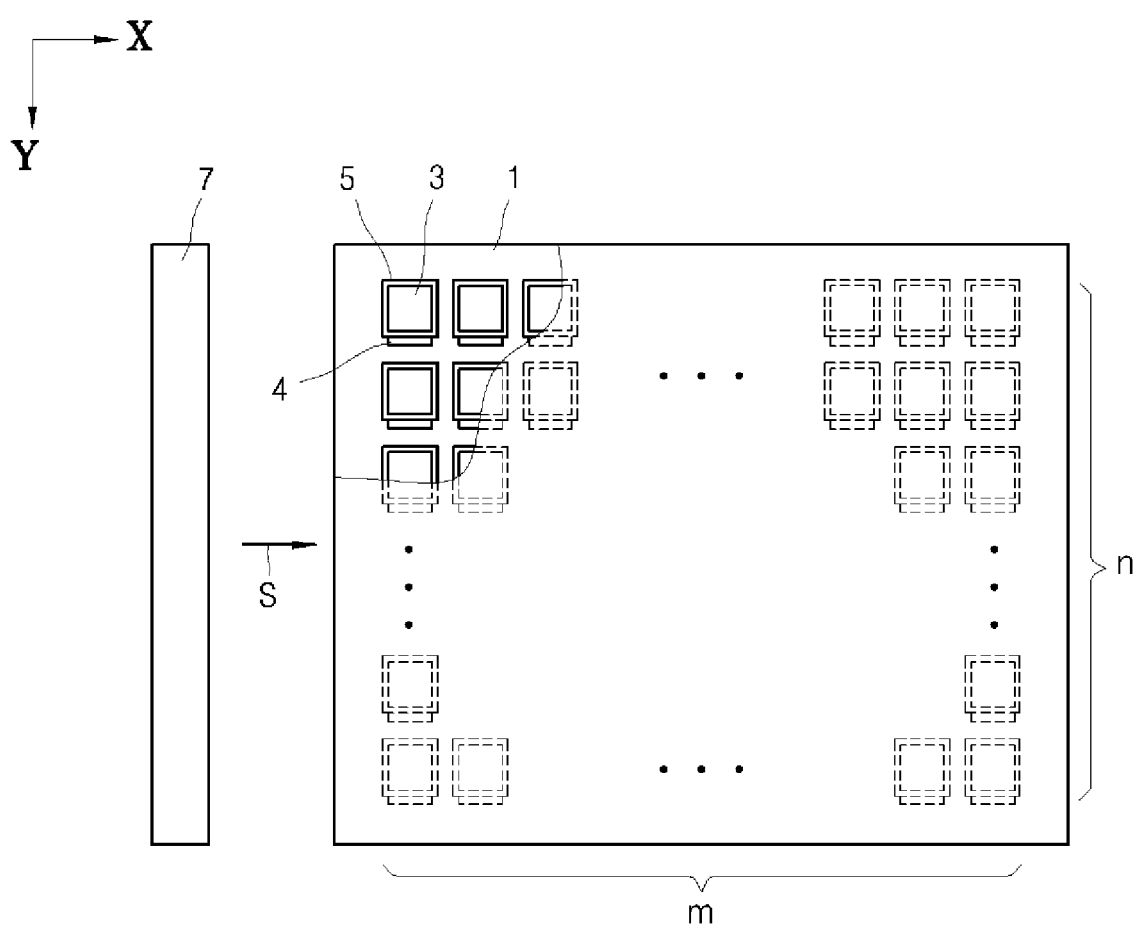
FIG. 12 is a plan view of another example of a substrate that is used in a flat panel display device manufactured using a method of manufacturing a flat panel display device according to an embodiment of the present invention.

Although in the previously described embodiment laser beams are simultaneously irradiated onto cells aligned in a row in the first direction X and then the scanning is performed in the second direction Y, the present invention is not limited thereto. As illustrated in FIG. 12, laser beams may be simultaneously irradiated onto cells aligned in a row in the second direction Y and then, scanning may be performed in the first direction X.

The embodiments of the present invention have been described with reference to organic light emitting display devices. However, aspects of the present invention can also be applied to other flat panel display devices, such as liquid crystal display devices or inorganic electric light emitting display devices.

After walls are hardened in such a manner as described above, the first and second substrates are cut and divided into a plurality of display devices.

According to aspects of the present invention, a first substrate and a second substrate, which are mother glasses, have a more uniform thermal stress and are less exposed to additional thermal stress caused when laser beams are irradiated to neighboring cells. As a result, devices defects, such as cutting defects or Newton-ring defects, can be prevented.

Since laser emission diodes are connected and aligned in a first direction, a linear laser beam having a uniform intensity can be obtained. In addition, the size of the linear laser beam can be easily changed to correspond to the size of different mother glasses.

A light shielding region of a mask may include at least two shielding portions which are separated from each other and arranged in a direction in which laser beams pass. Accordingly, when the substrates are irradiated with a linear laser beam extending in the first direction, emission units can be protected from inclined laser beams.

When the light shielding region includes a first shielding portion and a second shielding portion and the first shielding portion and the second shielding portion include light reflection layers, emission units can be protected from laser beams, and also, an increase in the temperature of the mask caused by laser beams can be prevented.

When the first shielding portion and the second shielding portion include light absorbance layers, an increase in the temperature of a chamber in which the manufacturing process is performed, caused by laser beams can be prevented.

For each cell, first walls aligned in the first direction are simultaneously melted and hardened, and thus, the adhesive force is enhanced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a flat panel display device, the method comprising:
   providing a plurality of emission units between a first substrate and a second substrate, wherein the first substrates faces the second substrate and each emission unit forms a unit display device;
   providing a plurality of walls between the first substrate and the second substrate, wherein each of the walls respectively surrounds one of the emission units;
   simultaneously irradiating a laser beam to a plurality of first wall portions aligned in a row in a first direction;
   scanning the laser beam in a second direction, wherein the second direction is different from the first direction to irradiate other wall portions of the plurality of walls; and
   cutting the first and second substrates to obtain individual unit display devices, wherein each of the walls surrounding an emission unit comprises the first wall portions, which extend in the first direction, and second wall portions, which extend in the second direction, wherein the laser beam is simultaneously irradiated onto each of the first wall portions aligned in a row in the first direction, and simultaneously irradiated to at least a portion of the second walls.

2. The method of claim 1, wherein the first direction is perpendicular to the second direction.

3. The method of claim 1, wherein the laser beam passes through a mask and arrives at the walls, wherein the mask comprises:
   a light transmissible region through which the laser beam passes; and
   a light shielding region which shields the laser beam, surrounds the light transmissible region, and comprises a plurality of shielding portions that are separated and arranged in a direction in which the laser beam passes.

4. The method of claim 3, wherein a dielectric layer is interposed between the plurality of shielding portions.

5. The method of claim 3, wherein the mask comprises a transparent glass having a first surface and a second surface, wherein on respective sides of the transparent glass the light shielding region comprises a first shield portion formed on the first surface of the transparent glass and a second shield portion formed on the second surface of the transparent glass.

6. The method of claim 5, wherein the first shield portion and the second shield portion have different patterns.

7. The method of claim 3, wherein the mask comprises a transparent glass having a first surface and a second surface on respective sides of the transparent glass, wherein the light shielding region comprises first shield portion formed on the first surface of the transparent glass and a second shield portion formed on the second surface of the transparent glass and wherein at least one of the first shield portion and the second shield portion includes a plurality of shield portion layers separated by a dielectric layer.

8. The method of claim 3, wherein the mask comprises a transparent glass having a first surface and a second surface on respective sides of the transparent glass, wherein the light shielding region comprises first shield portion formed on the first surface of the transparent glass and a second shield portion formed on the second surface of the transparent glass and wherein each of the first shield portion and the second shield portion includes a plurality of shield portion layers separated by a dielectric layer.

9. The method of claim 3, wherein the light transmissible region and the walls have the same patterns.

10. The method of claim 1, wherein the laser beam is irradiated by a plurality of laser emission diodes that are connected to each other and aligned in a row, and simultaneously emit light.

11. The method of claim 1, wherein the laser beam is a rectangular linear laser beam, wherein a longer side of the linear laser beam has a length corresponding to the width of the plurality of first wall portions aligned in the first direction.

12. A method of manufacturing a flat panel display device, the method comprising:
providing a first substrate, a second substrate, a plurality of emission units disposed on the first substrate or the second substrate and a plurality of walls of a laser sealable material, wherein the first substrates faces the second substrate, wherein each emission unit forms a unit display device, wherein each emission unit is surrounded by one of the plurality of walls, wherein each of the plurality of walls includes first wall portions extending in a first direction and a second wall portions extending in a second direction different from the first direction and wherein the plurality of emission units are arranged to provide a plurality of the first wall portions aligned in a row in the first direction;
providing a laser illuminator comprising a plurality of laser emitters extending in the first direction;
scanning the laser illuminator in the second direction such that first wall portions aligned in a row in the first direction are simultaneously irradiated and second wall portions extending in the second direction are progressively irradiated as the laser illuminator is scanned, such that each emission unit becomes sealed to provide a unit display device.

13. The method of claim 12, further including cutting the first and second substrates to separate the unit display devices.

14. The method of claim 12, further including providing a mask that allows laser beams from the laser illuminator to irradiate the plurality of walls and that prevents laser beams from the laser illuminator from irradiating the emission units.

15. The method of claim 14 wherein the mask includes shielding portions shielding portions that are separated from each other in a direction in which laser beams from the laser illuminator pass and wherein the shielding portions arranged such that laser beams that are incident on the mask at a predetermined angle different from 90° irradiate the plurality of walls.

16. The method of claim 14 wherein the mask includes shielding portions that are separated from each other in a direction in which laser beams from the laser illuminator pass and wherein the shielding portions arranged such that laser beams that are incident on the mask at a predetermined angle different from 90° are blocked by the mask.

17. The method of claim 12, wherein the laser illuminator has a width such that an entire row of first wall portions aligned in a row in the first direction is simultaneously irradiated.

18. The method of claim 17, wherein only one scanning of the laser illuminator in the second direction is carried out.

19. The method of claim 12, wherein the laser illuminator has a width that is less than a width of an entire row of first wall portions aligned in a row in the first direction and wherein the method comprises conducting a first scanning of the laser illuminator in the second direction to irradiate a first region containing first wall portions and second wall portions and then conducting a second scanning of the laser illuminator in the second direction to irradiate a second region containing first wall portions and second wall portions.

20. The method of claim 12, wherein the laser illuminator irradiates the first wall portions and the second wall portions with laser beams that are directed to the first substrate or the second substrate.

21. The method of claim 20, wherein the laser illuminator irradiates the first wall portions and the second wall portions with laser beams that are directed to both the first substrate and the second substrate.

22. A method of manufacturing a flat panel display device, the method comprising:
providing a plurality of emission units arranged in a matrix having a plurality of rows and a plurality of columns and being arranged between a first substrate and a second substrate that faces the first substrate, wherein each emission unit forms a unit display device;
providing a plurality of walls between the first substrate and the second substrate, wherein each of the walls surrounds a corresponding one of the emission units;
simultaneously irradiating, via a laser illuminator, ones of the walls corresponding to an entire row of emission units arranged in a first direction;
simultaneously irradiating others of the walls corresponding to other rows of emission units by moving the laser illuminator in a second direction that is different from the first direction; and
cutting the first and second substrates to obtain a plurality of individual unit display devices.

23. The method of claim 22, wherein the walls are comprised of frit glass.

24. The method of claim 22, wherein the laser illuminator comprises a plurality of laser emission diodes arranged in the first direction that extend across an entire row of emission units from a leftmost emission unit in the row to a rightmost emission unit in the row.

25. The method of claim 22, wherein the laser illuminator produces a laser beam having a uniformity within +/−5%.

26. The method of claim 22, wherein the laser illuminator comprises a plurality of laser emission diodes arranged in the first direction and extending across a row of emission units and having a length that corresponds to an entire row of the emission units arranged between the first and the second substrates.

* * * * *